United States Patent
Godet et al.

(10) Patent No.: US 9,268,228 B2
(45) Date of Patent: Feb. 23, 2016

(54) TECHNIQUES FOR PATTERNING A SUBSTRATE

(71) Applicant: Varian Semiconductor Equipment Associates, Inc., Gloucester, MA (US)

(72) Inventors: Ludovic Godet, Sunnyvale, CA (US); Tristan Ma, Lexington, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/176,856

(22) Filed: Feb. 10, 2014

(65) Prior Publication Data

US 2014/0242523 A1 Aug. 28, 2014

Related U.S. Application Data

(60) Provisional application No. 61/768,417, filed on Feb. 23, 2013.

(51) Int. Cl.
| | |
|---|---|
| *G03F 7/26* | (2006.01) |
| *G03F 7/09* | (2006.01) |
| *G03F 7/40* | (2006.01) |
| *H01L 21/00* | (2006.01) |

(52) U.S. Cl.
CPC ......... *G03F 7/091* (2013.01); *G03F 7/26* (2013.01); *G03F 7/40* (2013.01); *H01L 21/00* (2013.01)

(58) Field of Classification Search
CPC ......................................................... G03F 7/26
See application file for complete search history.

(56) References Cited

U.S. PATENT DOCUMENTS

| | | | | |
|---|---|---|---|---|
| 5,885,886 | A * | 3/1999 | Lee ................................ | 438/528 |
| 2008/0081382 | A1* | 4/2008 | Yang et al. ...................... | 438/14 |
| 2013/0048605 | A1* | 2/2013 | Sapre et al. ..................... | 216/51 |

* cited by examiner

*Primary Examiner* — Kathleen Duda

(57) ABSTRACT

Various techniques for patterning a substrate are disclosed. Specifically, implantation of the first species into an anti-reflective coating layer is contemplated to reduce stress in the layer that may be generated during the exposure stage or development stage. During these steps, the resist layer or the resist structure may under mechanical changes (e.g. shrinkage) while it is in contact with the anti-reflective layer. Such changes may introduce stress in the anti-reflective layer, which may contribute to excessive line edge roughness (LER) or line width roughness (LWR). By implanting the first species before, during, or after these steps, the stress in the anti-reflective layer may be avoided or compensated, and excessive LER or LWR may be avoided or reduced.

15 Claims, 6 Drawing Sheets

300

400

TECHNIQUES FOR PATTERNING A SUBSTRATE

This application claims priority of U.S. Provisional Patent Application Ser. No. 61/768,417, filed Feb. 23, 2013, the disclosure of which is incorporated by reference in its entirety.

FIELD

The present disclosure relates generally to techniques for substrate processing, more particularly to techniques for patterning resist formed on a substrate.

BACKGROUND

Patterning process is one of many processes used in manufacturing electronic devices, including integrated circuit (IC) devices. It is a process used to form features on a substrate, on which the devices are formed. One of the patterning processes used is photo-lithography. In this process, a layer of photoresist is deposited on a substrate. Thereafter, a mask having with an aperture arranged in a desired pattern is disposed is positioned between the substrate and a light source. The radiation from the light source is then directed toward the substrate, and the pattern of the aperture in the mask is imaged on the photoresist. Thereafter, the photoresist is exposed to a developer solution, such as tetramethyl ammonium hydroxide. As the radiation exposure causes the photoresist to become soluble to the developer solution, the portion of the photoresist exposed to the radiation is dissolved and removed from the substrate. Meanwhile, another portion not exposed to the radiation may remain insoluble and remain on the substrate as the resist structures. The remaining resist structures, which may correspond to the aperture pattern of the mask, may be baked and further hardened. These resist structures may be used as a mask for subsequent, for example, etching process, and the features corresponding to the resist structures may form on the substrate.

With increased demand for smaller devices with more complex circuitry, the feature size requirement has become more stringent. Unfortunately, limitations in the scaling of the photolithography systems can no longer meet the device scaling requirements. For example, it has been found that the conventional photolithography may result in resist structures with excessive line edge roughness (LER) or line width roughness (LWR), instead of smooth well defined resist structures. If present, LER or LWR from the resist structures is transferred to the substrate below during the etching process, and these defects may be transferred onto the substrate. Such defects may result in device degradation usually in transistor or parametric stability. Depending on the design, short, medium or long range roughness will have detrimental impact on the device.

Accordingly, a new process that limits or reduces the LER and LWR in photolithographic process is needed.

SUMMARY

Various techniques for patterning a substrate are disclosed. Specifically, implantation of the first species into anti-reflective coating layer is contemplated to reduce stress in the layer that may be generated during the exposure stage or development stage. During these steps, the resist layer or the resist structure may under mechanical changes (e.g. shrinkage) while it is in contact with the anti-reflective layer. Such changes may introduce stress in the anti-reflective layer, which may contribute to excessive line edge roughness (LER) or line width roughness (LWR). By implanting the first species before, during, or after these steps, the stress in the anti-reflective layer may be avoided or compensated, and excessive LER or LWR may be avoided or reduced.

According to one embodiment, a method of patterning a substrate is disclosed. The method comprises coating the substrate with an intermediate layer; implanting first impurities into the intermediate layer; depositing a resist layer on the intermediate layer; exposing a portion of the resist layer to a radiation source; removing the portion of the resist layer to expose a portion of the intermediate layer; and etching the portion of the intermediate layer.

According to a second embodiment, another method of patterning a substrate is disclosed. The method comprises coating the substrate with an inorganic anti-reflective coating layer; implanting first impurities into the anti-reflective coating layer, so that the first impurities are present through the anti-reflective coating layer from an upper surface to a lower surface; depositing a resist layer on the upper surface of the anti-reflective coating layer; exposing a portion of the resist layer to a radiation source; removing the portion of the resist layer to expose a portion of the anti-reflective coating layer; and etching the portion of the anti-reflective coating layer.

According to a third embodiment, another method of patterning a substrate is disclosed. The method comprises forming a resist structure on top of an anti-reflective coating layer disposed on the substrate, where the resist structure covers a first portion of the anti-reflective coating layer and a second portion of the anti-reflective coating layer is exposed; implanting first impurities into the anti-reflective coating layer after the resist structure is formed; implanting active impurities into the resist structure; and etching the second portion of the anti-reflective coating layer after implanting the first impurities and the active impurities.

BRIEF DESCRIPTION OF THE FIGURES

For a better understanding of the present disclosure, reference is made to the accompanying drawings, which are incorporated herein by reference and in which.

DETAILED DESCRIPTION

The present disclosure will now be described in more detail with reference to particular embodiments thereof as shown in the accompanying drawings. While the present disclosure is described below with reference to particular embodiments, it should be understood that the present disclosure is not limited thereto. For example, the present disclosure includes a step in which impurities are added to an intermediate layer interposed between the substrate and the photoresist or one or more resist structures. In several embodiments of the present disclosure, the intermediate layer may be a backside anti-reflective coating (BARC) layer. In other embodiments, there may be a plurality of intermediate layers, one of which may be the BARC layer. If multiple intermediate layers are present, the BARC layer may be in contact with the photoresist or one or more resist structures.

For clarity and simplicity, the present disclosure will focus on adding the impurities in a form of atomic or molecular ions via ion implantation process. However, those of ordinary skill in the art will recognize that the impurities may be introduced via other doping or impurities introducing processes.

Referring to FIG. 1A-1E, there is shown an exemplary method 100 for patterning a substrate according to one embodiment of the present disclosure. In the present embodiment, the substrate 102 may be coated with one or more intermediate layers, one of which may be a BARC layer 104. If multiple intermediate layers are coated onto the substrate 102, the BARC layer 104 may be positioned above other intermediate layers. The BARC layer 104 may be organic or inorganic anti-reflective coating layer.

Figures 1A, 1B:
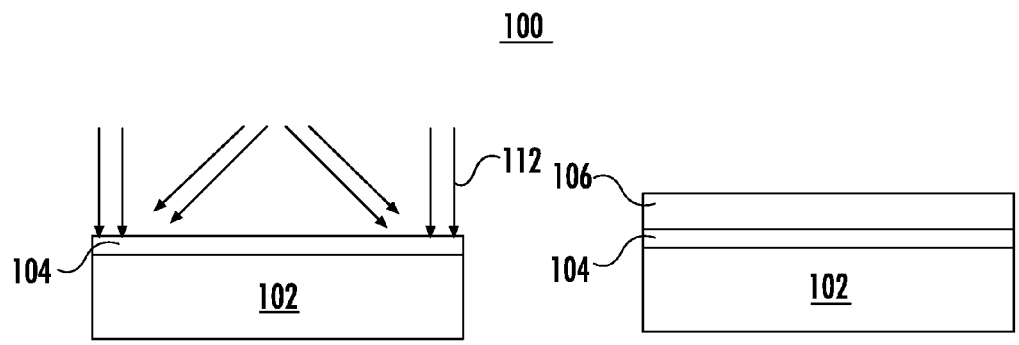
FIGS. 1A-1E show method of patterning a substrate according to one embodiment.

As illustrated in FIG. 1A, the first impurities 112 may be added to the BARC layer 104. In the present embodiment, the first impurities 112 may be in the form of atomic or molecular ions and added via ion implantation process. As shown in FIG. 1A, the first impurities 112 may be directed toward the BARC layer 104 at one or more angles. In addition, the first impurities 112 may be implanted at one or more implant energies such that implant depth of the first impurities 112 extends to the lower surface of the BARC layer 104. In other embodiments, the first impurities 112 may be implanted at lower energy to achieve lower implant depth or such that the implant depth of the first impurities 112 does not extend to the lower surface of the BARC layer 104.

The first impurities 112 may be atomic or molecular ions containing one or more species. Specific examples of the species may include hydrogen (H), helium (He), neon (Ne), argon (Ar), krypton (Kr), and xenon (Xe), and combination thereof. Moreover, those species not listed above are not precluded in the present disclosure. Specific examples of other species may include carbon (C), nitrogen (N), oxygen (O), silicon (Si), germanium (Ge), and a combination thereof.

In the present embodiment, lighter species such as H and He are preferred. The lighter species are preferred as such species, when implanted, may be introduced to a greater depth without excessively sputtering the BARC layer 104. After the implantation process, the lighter species may be present throughout the BARC layer 104, from the upper to lower surfaces. If the heavier species such as Ar is used, the species may have to be introduced at greater implant energy such that species may also be present near the lower surface of the BARC layer 104. However, excessive implant energy may result in excessive sputtering. As such, the lighter species are preferred. However, those skilled in the art will recognize that the heavier species are not precluded in the present disclosure.

In the present disclosure, various implant energies may be used to introduce the first impurities 112. In the present embodiment, the implant energies may range between about 50 V to about 20 kV. Depending on the type of species used as the first impurities 112, different implant energies may be used. For example, light species (e.g. H and He) may be implanted with lower energy, whereas heavy species (e.g. Ar, Ge, Kr, Xe, etc. . . . ) may be implanted at higher implant energy. Specific example of the implant energy used to implant He species may range between about 0.75 kV to about 2 kV. Meanwhile, specific example of the implant energy used to implant He species may range between about 0.25 kV to about 1.5 kV. Specific example of the implant energy used to implant Si species may range between about 1 kV to about 5 kV. Those of skilled in the art will recognize that other implant energies are not precluded in the present disclosure. Any implant energies that enable sufficient and uniform implantation from the upper and lower region of the BARC layer 104 may be used. Further, those skilled in the art will recognized that the implant energy may be varied or remain constant during the ion implantation process.

During the ion implantation process, the substrate 102 may be maintained at constant or varied temperatures temperature of the substrate 102 may range between about −100° C. to about 600° C. However, the substrate 102 may preferably be maintained, between about 0° C. to about 100° C.

As illustrated in FIG. 1B, a resist layer 106 may be deposited on the BARC layer 104. In the present embodiment, the deposition of the resist layer 106 may occur after the implantation of the first impurities into the BARC layer 104. However, those skilled in the art will recognize that the present disclosure does not preclude implantation of the first impurities 112 into the BARC layer 104 after the deposition of the resist layer 106.

Figures 1C, 1D:
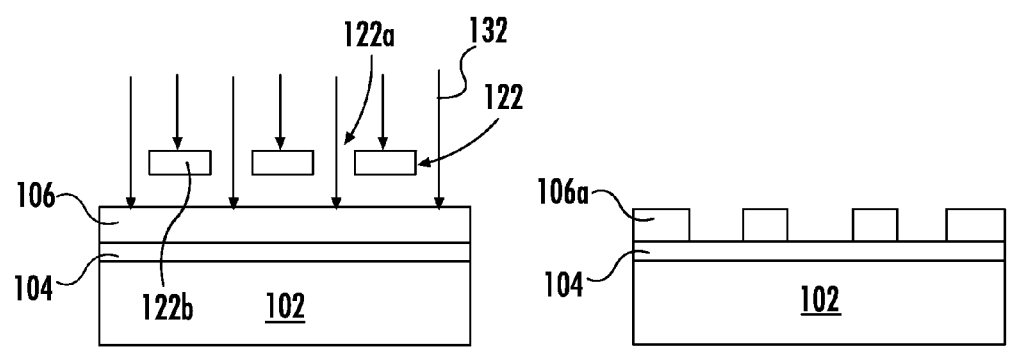

After deposition of the resist layer 106, the exposure step may take place as illustrated in FIG. 1C. During the exposure step, a mask 122 is disposed between the resist layer 106 and a light source (not shown), and the radiation 132 from the light source is directed toward the resist layer 106. In the present embodiment, the light source may be an ultraviolet (UV) light source emitting UV radiation in the range of about 193 nm. However, those of ordinary skill in the art will recognize that radiation, with other wavelengths may also be used.

The mask 122 may comprise one or more transparent areas 122a, such as apertures, defined by one or more opaque areas 122b. The transparent areas 122a may be arranged in a desired pattern. As shown in FIG. 1C, the radiation 132 may pass through the transparent areas 122a, but not through the opaque areas 122b. In the process, the pattern of the apertures may be imaged on the resist layer 106, and one or more regions of the resist layer 106 are exposed to the radiation 132. This exposure step is followed by a resist development step, where the resist layer 106 is exposed to developer or alkaline solution, and the portion of the resist layer 106 that was exposed to the radiation 132 is removed. After the resist development step, one or more resist structure 106a may form on the substrate 102, as shown in FIG. 1D. Moreover, the BARC layer 104 may be exposed through the gap between the resist structure 106a.

Figure 1E:
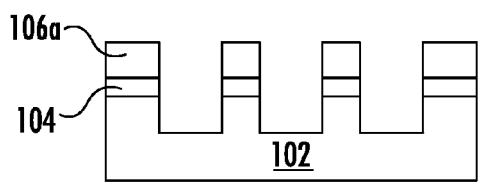

After forming the resist structure 106a in a desired shape and pattern, the substrate 102 may undergo an etching process. During this process, the exposed portion of the BARC layer 104 and the portion of the substrate 102 thereunder may be etched as shown in FIG. 1E.

Referring to FIG. 2A-2F, there is shown another exemplary method 200 for patterning a substrate according to one embodiment of the present disclosure. Those of ordinary skill in the art will recognize that several steps and features included in the previous embodiment shown in FIG. 1A-1E are also included in the present embodiment. Detailed descriptions of such repeating steps and features may be omitted. As such, the method of the present embodiment should be understood in relation to the method shown in FIG. 1A-1E.

Figure 2A:
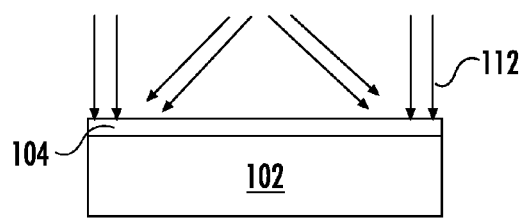
FIGS. 2A-2F show a method of patterning a substrate according to a second embodiment.
Figure 2B:
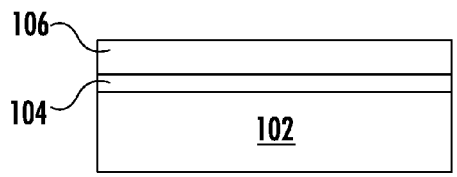
Figure 2C:
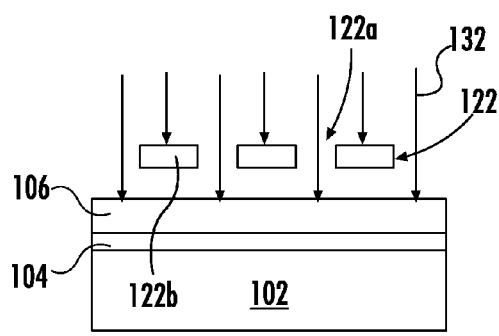
Figure 2D:
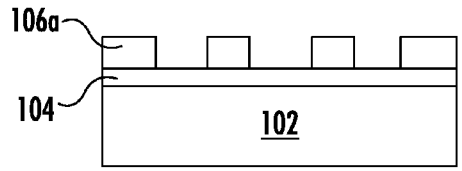
Figure 2E:
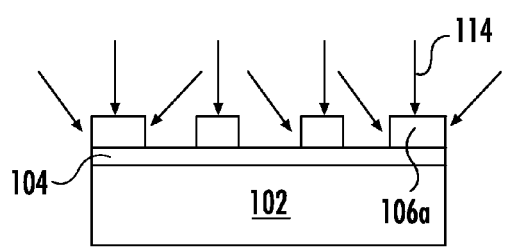

As illustrated in FIG. 2A, the first impurities 112 may be added to the BARC layer 104. Before, during, or after the first impurities 112 are added to the BARC layer 104, the resist layer 106 may be deposited thereon. The resist layer 106 may be exposed to the radiation 132, as shown in FIG. 2C, and developed, as shown in FIG. 2D, to form the resist structure 106a After forming the resist structure 106a, active impurities 114 may be introduced into the resist structure 106a, as illustrated in FIG. 2E. In the present disclosure, the active impurities 114 may further smooth any LER or LWR present in the resist structure 106a The active impurities 114 may be atomic or molecular ions containing one or more species. Specific examples of the species may include carbon (C), nitrogen (N), oxygen (C), silicon (Si), germanium (Ge), and a combination thereof. In addition, the active impurities 114 may contain one or more species contained in the first impurities 112 (e.g. H, He, Ne, Ar, Kr, and Xe). Without wishing to be bound to a particular theory, it is believed that the active impurities 114 may reduce LER and LWR by hardening the resist structure 106a.

Figure 2F:
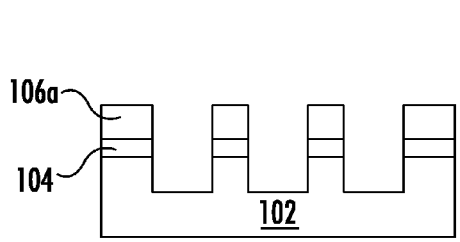

After the implantation of the active impurities 114, the etching process may be performed on the substrate 102 to form a desired pattern, as illustrated in FIG. 2F.

Referring to FIG. 3A-3F, there is shown another exemplary method 200 for patterning a substrate according to one embodiment of the present disclosure. Those of ordinary skill in the art will recognize that several steps and features included in the previous embodiment shown in FIGS. 1A-1E and 2A-2F are also included in the present embodiment. Detailed descriptions of such repeating steps and features may be omitted. As such, the method of the present embodiment should be understood in relation to the method shown in FIGS. 1A-1E and 2A-2F.

Figure 3A:
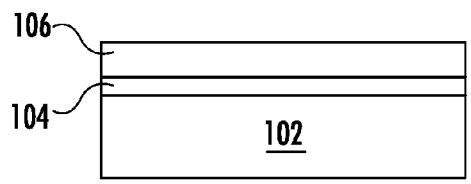
FIGS. 3A-3F show a method of patterning a substrate according to a third embodiment.
Figure 3B:
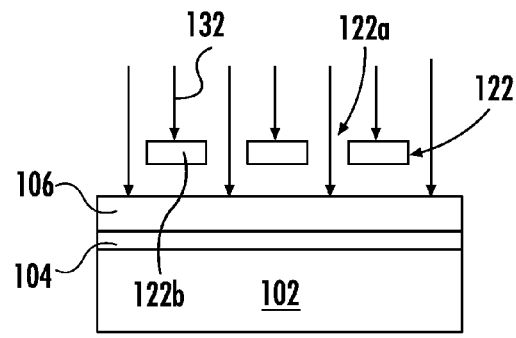
Figure 3C:
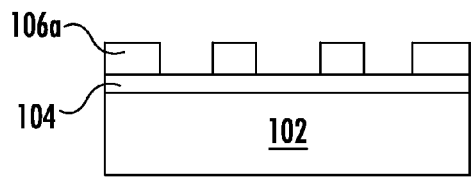
Figure 3D:
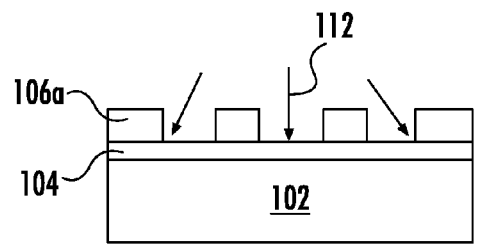
Figure 3E:
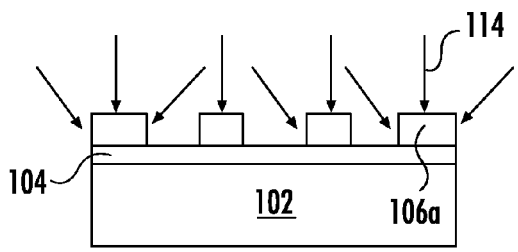
Figure 3F:
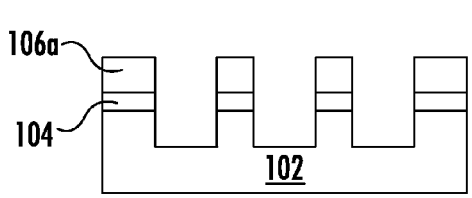

In the present embodiment, the resist layer 106 is deposited onto the BARC layer 104 as illustrated in FIG. 3A. Thereafter, the exposure step, as shown in FIG. 3B, and the development step, as shown in FIG. 3C, are performed to form the resist structure 106a After the resist structure 106a is formed, the first impurities 112 are introduced into the BARC layer 104 at one or more angles as shown in FIG. 3D. In the present embodiment, implanting the first impurities 112 at one or more angles is preferred in order to introduce the first impurities 112 at portions of the BARC layer 104 below the resist structure 106a and near the side wall of she resist structure 106a Thereafter, as shown in FIG. 3E, the active impurities 114 may be introduced into the resist structure 106a After the introduction of the active impurities 114, the etching process may be performed to transfer the pattern of the resist structure 106a to the substrate 102.

Referring to FIG. 4A-4E, there is shown another exemplary method 200 for patterning a substrate according to one embodiment of the present disclosure. Those of ordinary skill in the art will recognize that several steps and features included in the previous embodiment shown in FIGS. 1A-1E, 2A-2F, and 3A-3F are also included in the present embodiment. Detailed descriptions of such repeating steps and features may be omitted. As such, the method of the present embodiment should be understood in relation to the method shown in FIGS. 1A-1E, 2A-2F, and 3A-3F.

Figure 4A:
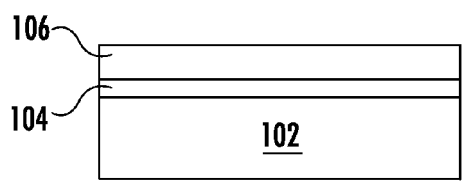
FIGS. 4A-4E show a method of patterning a substrate according to a fourth embodiment.
Figure 4B:
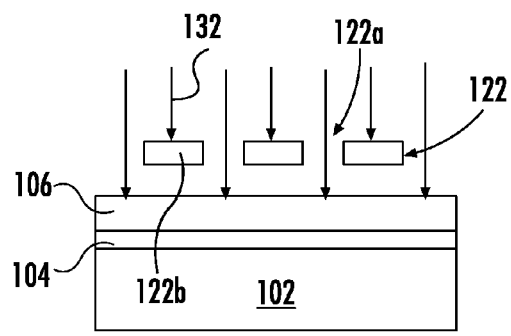
Figure 4C:
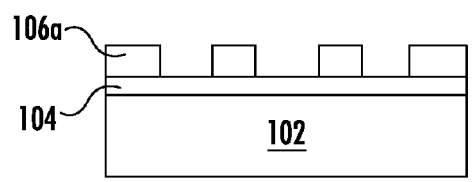
Figure 4D:
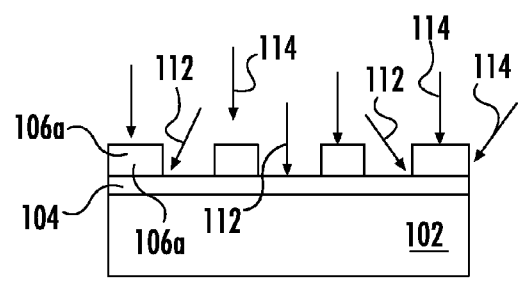
Figure 4E:
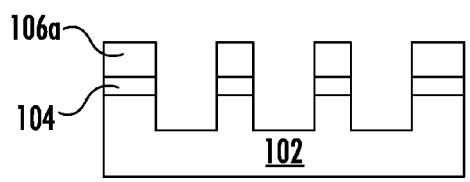

In the present embodiment, the resist layer 106 is deposited onto the BARC layer 104 as illustrated in FIG. 4A. Thereafter, the exposure step, as shown in FIG. 4B, and the development step, as shown in FIG. 4C, are performed to form the resist structure 106a Thereafter, as shown in FIG. 4D, the first impurities 112 and the active impurities 114 may be introduced into the resist structure 106a and the BARC layer 104 at one or more angles. In the present disclosure, the species in the first impurities 112 and the active impurities 114 may be the same or different. After the implantation of the first impurities 112 and the active impurities 114 into the resist structure 106a and the BARC layer 104, the etching process may be performed on the substrate 102 to transfer the pattern of the resist structure 106a onto the substrate 102.

Referring to FIG. 5A-5F, there is shown another exemplary method 200 for patterning a substrate according to one embodiment of the present disclosure. Those of ordinary skill in the art will recognize that several steps and features included in the previous embodiment shown in FIGS. 1A-1E, 2A-2F, 3A-3F, and 4A-4E, are also included in the present embodiment. Detailed descriptions of such repeating steps and features may be omitted. As such, the method of the present embodiment should be understood in relation to the method shown in FIGS. 1A-1E, 2A-2F, 3A-3F, and 4A-4E.

Figure 5A:
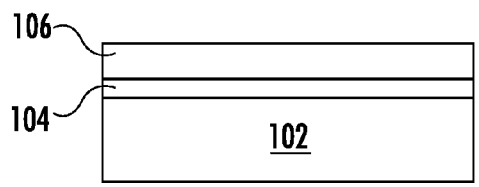
FIGS. 5A-5F show a method of patterning a substrate according to a fifth embodiment.
Figure 5B:
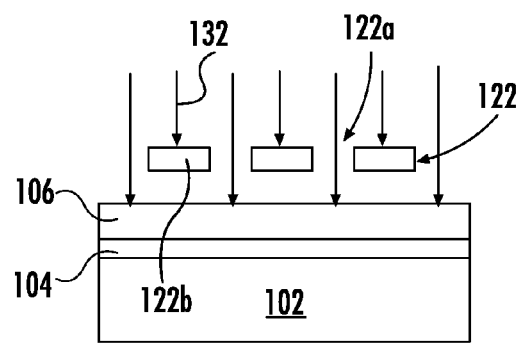
Figure 5C:
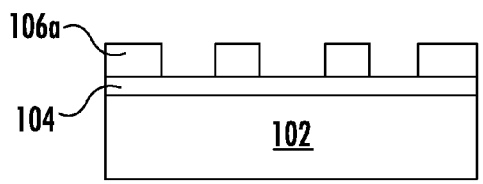
Figure 5D:
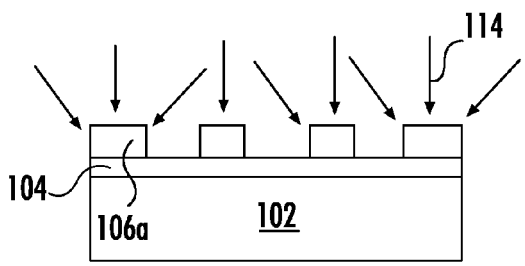
Figure 5E:
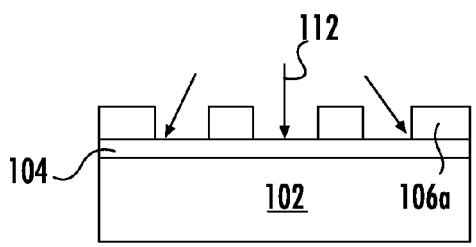
Figure 5F:
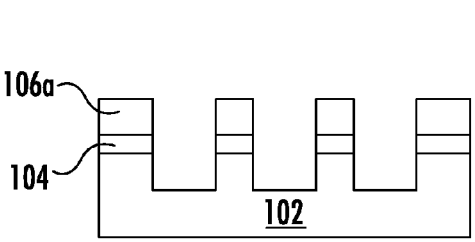

In the present embodiment, the resist layer 106 is deposited onto the BARC layer 104 as illustrated in FIG. 5A. Thereafter, the exposure step, as shown in FIG. 5B, and the development step, as shown in FIG. 5C, are performed to form the resist structure 106a Thereafter, as shown in FIG. 5D, the active impurities 114 may be introduced into the resist structure 106a and harden the resist structure 106a After introducing the active impurities 114, the first impurities 112 may be introduced into the resist structure 106a at one or more angles as shown in FIG. 5E. In the present embodiment, implanting the first impurities 112 at one or more angles is preferred in order to introduce the first impurities 112 at portions of the BARC layer 104 below the resist structure 106a and near the side wall of the resist structure 106a After the introduction of the active impurities 114, the etching process may be performed to transfer the pattern of the resist structure 106a to the substrate 102 as illustrated in FIG. 5F.

In the present disclosure, implantation of the first impurities 112 into the BARC layer 104 is contemplated to reduce stress in the BARC layer 104 that may be generated during the exposure stage, development stage, and/or the implantation of the active impurities 114 stage. During these steps, the resist layer 106 or the resist structure 106a may under mechanical changes (e.g. shrinkage) while it is in contact with the BARC layer 104. Such changes may introduce stress in the BARC layer 104. It is believed that the stress in the BARC layer 104 may contribute to LER or LWR. By implanting the first impurities 112 before, during, or after these steps, the stress in the BARC layer 104 may be avoided or compensated, and LER or LWR may be avoided.

For example, during an ion implantation process, the energetic ions cause polymer chain fragmentation and new cross-linking within organic BARC layer 104. The former favors chain re-organization, whereas the latter hinders such chain movement, leading to strains within BARC layer 104. Upon completion of BARC layer 104 opening through etch, restraints imposed by the resist structure 106a and adjacent BARC layer 104 are removed. The removal of such restrains allows the buckling lines to relax and deform, which leads to highly correlated line edges post etch in the case of the implanted resist.

By implanting substantially entire BARC layer 104 along its height with the first impurities 112, formation of several layers in the BARC layer 104 under different strain may be avoided. In addition, existing stress accumulation inside the BARC layer 104, which may cause excessive LER or LWR, may also be reduced. As a result, more definite resist structure 106a, and ultimately, features on the substrate 102 may form.

In the present embodiment, additional treatment such as UV and thermal treatment may be performed before, during, or after the implantation of the first impurities 112 into the BARC layer 104. Moreover, such treatments may also be performed before, during, or after the implantation of the active impurities 114.

Figure 6A:
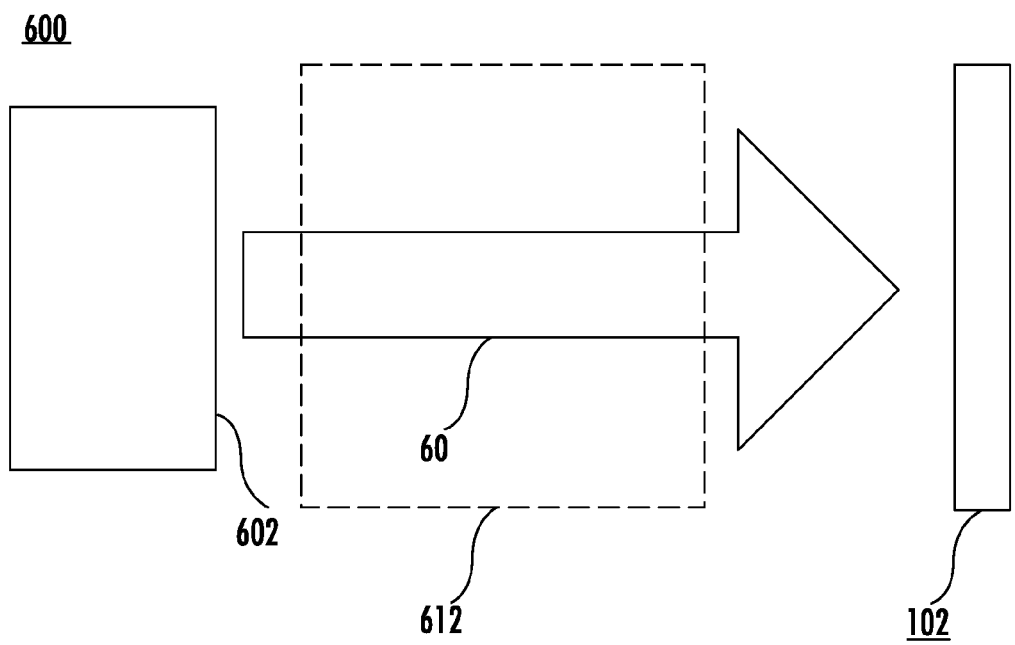
FIGS. 6A-6B show an ion implantation system according to one embodiment.
Figure 6B:
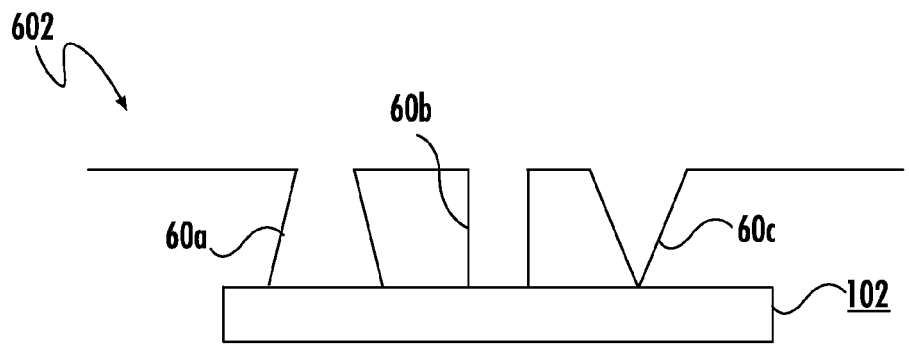

Referring to FIGS. 6A and 6B, there is shown an ion implantation system 600 according to one embodiment of the present disclosure. The ion implantation system 600 comprises an ion source 602 for generating ions of desired species. Downstream of the ion source 602, there may be a substrate 102 in which the ions 60 from the ion source 602 may be directed. In the present disclosure, the ions 60 may be directed toward the substrate 102 in a form of diverging ion beam 60a, a parallel beam 60b, or converging beam 60c. With such beams 60, the ions (either the first impurities 112 or active impurities 114) may be introduced at one or more angles.

If desired, the ion implantation system 600 may further include one or more of beam-line components 612 which may focus, filter, or otherwise manipulate the ions 60 into an ion beam having desired properties (e.g. desired beam current, beam energy, implant angle, etc. . . . ).

Herein, techniques for patterning resist on a substrate are disclosed. The present disclosure is not to be limited in scope by the specific embodiments described herein. Indeed, other various embodiments of and modifications to the present disclosure, in addition to those described, herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of patterning a substrate, comprising:
   coating said substrate with an intermediate layer;
   implanting first impurities into said intermediate layer;
   depositing a resist layer on said intermediate layer, where said implanting is performed before said depositing;
   exposing a portion of said resist layer to a radiation source;
   removing said portion of said resist layer to expose a portion of said intermediate layer; and
   etching said portion of said intermediate layer.

2. The method of claim 1, wherein said first impurities comprise atomic or molecular ions containing one or more species selected from the group consisting of hydrogen, helium, neon, argon, krypton, xenon, carbon, nitrogen, oxygen, silicon and germanium.

3. The method of claim 1, wherein said first impurities are implanted to a depth equal to a thickness of said intermediate layer.

4. The method of claim 1, where said intermediate layer comprises an anti-reflective coating layer.

5. The method of claim 4, wherein said anti-reflective coating layer comprises an inorganic material.

6. The method of claim 1, further comprising implanting active impurities into said resist layer after said removing and before said etching.

7. The method of claim 6, wherein said active impurities comprise atomic or molecular ions containing one or more species selected from the group consisting of carbon, nitrogen, oxygen, silicon, and germanium.

8. A method of patterning a substrate, comprising:
   coating said substrate with an inorganic anti-reflective coating layer;
   implanting first impurities into said anti-reflective coating layer at one or more implant energies such that implant depth of said first impurities extends to a lower surface of said anti-reflective coating layer, so that said first impurities are present through said anti-reflective coating layer from an upper surface to said lower surface;
   depositing a resist layer on said upper surface of said anti-reflective coating layer;
   exposing a portion of said resist layer to a radiation source;
   removing said portion of said resist layer to expose a portion of said anti-reflective coating layer; and
   etching said portion of said anti-reflective coating layer.

9. The method of claim 8, wherein said first impurities comprise atomic or molecular ions of species selected from the group consisting of helium and hydrogen.

10. The method of claim 8, further comprising implanting active impurities into said resist layer after said removing and before said etching.

11. The method of claim 8, wherein said implanting first impurities is performed after said removing and before said etching.

12. The method of claim 8, wherein said first impurities comprise atomic or molecular ions containing one or more species selected from the group consisting of hydrogen, helium, neon, argon, krypton, xenon, carbon, nitrogen, oxygen, silicon and germanium.

13. A method of patterning a substrate, comprising:
   forming a resist structure on top of an anti-reflective coating layer disposed on said substrate, where said resist structure covers a first portion of said anti-reflective coating layer and a second portion of said anti-reflective coating layer is exposed;
   implanting first impurities into said anti-reflective coating layer, after said resist structure is formed, at one or more implant energies such that an implant depth of said first impurities extends to a lower surface of said anti-reflective coating layer;
   implanting active impurities into said resist structure; and
   etching said second portion of said anti-reflective coating layer after implanting said first impurities and said active impurities.

14. The method of claim 13, wherein said first impurities are implanted at a plurality of implant angles.

15. The method of claim 13, wherein said first impurities comprise atomic or molecular ions containing one or more species selected from the group consisting of hydrogen, helium, neon, argon, krypton, xenon, carbon, nitrogen, oxygen, silicon and germanium.

* * * * *